(12) United States Patent
Fox et al.

(10) Patent No.: US 10,811,735 B2
(45) Date of Patent: Oct. 20, 2020

(54) BATTERY ELECTROLYTE LEVEL MONITOR, SYSTEM, AND METHOD

(71) Applicant: Flow-Rite Controls, Ltd., Byron Center, MI (US)

(72) Inventors: Jason L. Fox, Holland, MI (US); Harrie W. Bonnah, II, East Grand Rapids, MI (US); Luke J. Paul, Jenison, MI (US); Matthew T. Shinew, Ada, MI (US)

(73) Assignee: FLOW-RITE CONTROLS, LTD., Byron Center, MI (US)

( * ) Notice: Subject to any disclaimer, the term of this patent is extended or adjusted under 35 U.S.C. 154(b) by 395 days.

(21) Appl. No.: 15/852,920

(22) Filed: Dec. 22, 2017

(65) Prior Publication Data
US 2019/0198947 A1    Jun. 27, 2019

(51) Int. Cl.
*H01M 10/48* (2006.01)
*G01N 27/414* (2006.01)
*G01R 31/371* (2019.01)
*G01R 31/396* (2019.01)
*G01F 1/00* (2006.01)
*G01R 19/165* (2006.01)
*H01M 10/20* (2006.01)

(52) U.S. Cl.
CPC .......... *H01M 10/484* (2013.01); *G01F 1/00* (2013.01); *G01N 27/414* (2013.01); *G01R 31/371* (2019.01); *G01R 31/396* (2019.01); *H01M 10/488* (2013.01); *G01R 19/16542* (2013.01); *H01M 10/20* (2013.01)

(58) Field of Classification Search
CPC .. G01R 31/3658; G01R 31/396; G01R 31/04; G01R 31/371; H01M 10/484; H01M 10/488
See application file for complete search history.

(56) References Cited

U.S. PATENT DOCUMENTS

| 3,891,465 A | 6/1975 | Muto et al. |
| 5,841,357 A | 11/1998 | Henry et al. |
| 6,820,483 B1 * | 11/2004 | Beckerman ........... G01F 23/243 73/290 R |

(Continued)

OTHER PUBLICATIONS

"Installing the i-Lite Sensor, Intended for Installation by Qualified Personnel, Part # BSVA1000," (Battery Watering Technologies) (Undated but admitted prior art).

(Continued)

*Primary Examiner* — Jimmy Vo
(74) *Attorney, Agent, or Firm* — Warner Norcross + Judd LLP (57) ABSTRACT

The specification discloses a monitor, a system, and a method for monitoring the electrolyte level in a cell of a multi-cell battery. The system may be powered by leads attached across any one or more cells of the battery. The system includes an electrically conductive probe, having its own wire, that may be installed in any battery cell. The probe is current sampled to provide one or more signals used to determine if the probe is in physical contact with the electrolyte (indicating acceptable electrolyte level). The probe may be sampled as a cathode and as an anode. The probe may be sampled using PWM (pulse width modulation). The probe may be sampled using current limiting.

16 Claims, 13 Drawing Sheets

(56) References Cited

U.S. PATENT DOCUMENTS

| | | |
|---|---|---|
| 2005/0001628 A1 | 1/2005 | Jones et al. |
| 2011/0106280 A1 | 5/2011 | Zeier |
| 2011/0183168 A1 | 7/2011 | Johnnie et al. |
| 2012/0328909 A1 | 12/2012 | Kim |
| 2013/0322488 A1 | 12/2013 | Yazami et al. |
| 2014/0266230 A1 | 9/2014 | Jones et al. |

OTHER PUBLICATIONS

"i-Lite Sensor, Battery Electrolyte Level Sensor for Industrial Applications," (Battery Watering Technologies) (Undated but admitted prior art).
"Installing the i-Lite Sensor, Intended for Installation by Qualified Personnel, Part # BSVA2000," (Battery Watering Technologies) (Undated but admitted prior art).
"Installing the i-Lite Sensor in Commercial Applications, Intended for Installation by Qualified Personnel, Part #BSVA1001," (Battery Watering Technologies) (Undated but admitted prior art).
"Installing the i-Lite Sensor in Commercial Applications, Intended for Installation by Qualified Personnel, Part #BSVA2001," (Battery Watering Technologies) (Undated but admitted prior art).
"Blinky," (Philadelphia Scientific 2015).
"Blinky Battery Watering Monitors: Precise, Reliable, Robust," (Philadelphia Scientific) (2018 but admitted prior art).
"SmartBlinky," (Philadelphia Scientific 2015).
"SmartBlinky Remote,"(Philadelphia Scientific 2015).
"SmartBlinky Pro," (Philadelphia Scientific 2015).
"Blinky, Philadelphia Scientific offers a complete selection of battery water level monitors," (Philadelphia Scientific 2014).
"Battery Boss WC," (Hawker Power Source) (Undated but admitted prior art).
"BBWC Report V4.0.0 US," (Hawker Power Source 2016).
"PL109142419—Battery Boss Data," (Hawker Power Source 2016).
"PL312151291—Battery Boss Data," (Hawker Power Source 2016).
"i-Lite Sensor for Commercial Applications," (Battery Watering Technologies) (2018 but admitted prior art).
"i-Lite Sensor for Industrial Applications," (Battery Watering Technologies) (2018 but admitted prior art).
"BasicBlinky," (Philadelphia Scientific) (2018 but admitted prior art).
"SmartBlinky," (Philadelphia Scientific) (2018 but admitted prior art).
"SmartBlinky Remote," (Philadelphia Scientific) (2018 but admitted prior art).
"SmartBlinky Pro," (Philadelphia Scientific) (2018 but admitted prior art).
"DC PowerLogger, Start Measuring, Start Managing," (Aker Wade) (2017 but admitted prior art).
"Battery Boss WC, Advanced Wireless Battery Data Management," (Hawker Power Source) (2018 but admitted prior art).
International Search Report and Written Opinion from PCT/US2018/062842 dated Feb. 5, 2019.

* cited by examiner

BATTERY ELECTROLYTE LEVEL MONITOR, SYSTEM, AND METHOD

BACKGROUND

The present invention relates to monitors, systems, and methods for monitoring the electrolyte level within a battery, and more particularly to electrical monitors, systems, and methods.

Monitors, systems, and methods for monitoring the electrolyte level within a battery are well known. However, such systems are limited in terms of where and how the electrolyte probes can be installed and used. The most prominent restriction is that the probes always have to be configured as cathodes in the battery system.

There are a couple of reasons that the probes are required to be configured as cathodes in the system. The first reason is that, when the probe is contacting the electrolyte and the voltage on the probe is measured, the probe will always have a positive voltage that may be used to directly drive an LED or an input. The second reason is so the probe will have a longer useful life. If the probe is configured as a cathode, then the probe will slowly become plated by materials inside of the battery cell, and the probe can survive and be useful for quite some time. On the other hand, if the probe were to be configured as an anode (i.e. so that current flows from the probe into the cell), then the probe would oxidize and fail relatively quickly.

When configured as a cathode, the current flows from the electrolyte in the cell of the probe, through the probe, to a measurement device (or in some cases directly to an LED), and then to the lower voltage potential point, which is sometimes the battery ground.

Known electrolyte level monitoring product offerings include the "Eagle Eye" product sold by Flow-Rite Controls of Byron Center, Mich.; the "i-Lite" product sold by Battery Watering Technologies of Clemmons, N.C.; the "Blinky" and "SmartBlinky" products sold by Philadelphia Scientific of Montgomeryville, Pa.; the "Battery Boss" product sold by Hawker Powersource of Ooltewah, Tenn.; and the "DC PowerLogger" product sold by Aker Wade Power Technologies of Charlottesville, Va.

Some of the known offerings could be classified as parasitic level monitors. In these devices, power is drawn from the battery cell with the probe in it, but only when the probe is touching electrolyte. The probe is installed two to four cells more positive than the device's ground wire. This installation assures the probe is always configured as a cathode. These devices are on 100% of the time that the probe is in contact with electrolyte, increasing wear on the probe and increasing the drain on the battery. These devices are 100% off when the probe is not in contact with electrolyte. As the voltage increases at the probe, the current draw of the device will also increase. These devices all have a maximum current or voltage rating that should not be exceeded or else they will be damaged. Examples of these offerings include the "Eagle Eye" product sold by Flow-Rite Controls and the "Blinky" product sold by Philadelphia Scientific.

Some of the known offerings are powered devices each with a separate probe and sometimes with a separate probe ground wire. The power range of these devices is from 4 V up to about 18 V. The probe and the ground wire (or separate probe ground wire) must be installed according to the same installation rules as for parasitic level monitors. Specifically, the probe must be two or more cells more positive than the device's ground wire. Examples of these offerings include the "i-Lite" product sold by Battery Watering Technologies, the "SmartBlinky" product sold by Philadelphia Scientific, and the "DC PowerLogger" product sold by Aker Wade.

All of the products described above require the probe to be configured as a cathode in the battery system. An installation of these products that is outside of the required installation locations will be damaged or will not function. The level monitors that use parasitic power configurations (i.e. drawing power for the device from the cell through the probe) have restrictions on the minimum and/or maximum number of cells between the probe and the ground wire. If installed with too many cells in between the probe and the ground wire, then the probe voltage is too high and the device will be damaged. If installed with too few cells in between the probe and ground sire, then the voltage cannot be detected accurately.

A further issue arises from some of the current offerings because of the limitations of design and installation. In some of the devices, the LED is illuminated directly from the voltage present on the probe that is in contact with the electrolyte. There is a problem with this from the viewpoint of the user. The lower the voltage on the probe or device power, then the dimmer the LED illuminates. This is especially the case if the probe is installed in the same cell as the ground wire (i.e. the probe sees less than one volt of potential). In this case, the LED is "on" but not practically illuminated so as to be visible. The opposite is also true. The higher the voltage on the probe, then the brighter the LED is illuminated. In extreme cases, the LED specifications will be exceeded, and the LED will be damaged. The voltage also may decrease or increase during normal use of the battery and during a battery charging cycle, which also and further affects LED intensity.

There is an inherent inaccuracy in the currently available battery electrolyte level monitors to be able to determine the height of the electrolyte level. The inaccuracy is due to the measurement of conductivity by measuring voltage. This method causes the monitors to be susceptible to (a) "stray voltages and currents" that are present on the top of lead-acid batteries and (b) battery/cell voltage changes due to the nature of charging and discharging a battery.

Currently available monitors switch on or off based upon a voltage threshold. The voltage is measured through the probe to a dedicated ground reference or to the monitor's power ground. The probe is installed in a battery cell through the top plate of the battery. Any device or material that is in contact with the battery top plate is susceptible to stray voltage and current. In level monitoring systems, the probe, the probe housing, or the probe gasket is directly in contact with the top plate of the battery and is susceptible to stray voltage and current. The switching voltage threshold for level monitor devices can be as low as 0.7 volts. Depending on (a) the two points on the battery where stray voltage is measured and (b) the size of the battery, anywhere from zero volts to tens (10s) of volts of stray voltage may be present on the battery top plate. If the stray voltage and current is large enough, then the voltage will conduct through the probe, probe housing, or probe gasket and can be measured on the probe—even if the probe is not touching the electrolyte. This situation can produce a false positive and therefore not properly alert the user of the battery when the battery needs additional water. Allowing the battery to operate with an insufficient amount of water will reduce the effective life of the battery, could be damaging to the battery, and in extreme cases could result in a thermal event in the battery.

As another issue in the golf cart market, the installation of known battery electrolyte level monitors requires modification of the top plate of the batteries, most notably by drilling a probe installation hole through the top plate. However, modifying the top plate of a battery typically voids the battery warranty provided by the battery manufacturer. Accordingly, the golf market has refused to use any of the industrial battery electrolyte level monitors that are currently offered, because such monitors require a hole to be drilled in the top plate during installation. This issue also exists in some industrial markets, such as parts of Asia, renewable energy markets, and backup battery markets.

SUMMARY

The above noted problems are addressed by the present invention relating to a monitor, a system, and a method for monitoring the electrolyte level in a cell of a multi-cell battery. The system may be powered by leads attached across any one or more cells of the battery. The system includes an electrically conductive probe, having its own wire that also may be installed in any battery cell. The probe is current sampled to provide one or more signals used to determine if the probe is in physical contact with the electrolyte (indicating acceptable electrolyte level). The probe may be sampled as a cathode and as an anode. The probe may be sampled using PWM (pulse width modulation). The probe may be sampled using current limiting.

The present invention provides a battery electrolyte level monitor and system (a) that may be installed in any of the cells of a multi-cell battery, (b) that has a relatively long life, and (c) that does not require modification of the battery top plate during installation.

The first feature—namely the ability to install the probe in any of the battery cells with full functionality—is referred to as "probe position independence."

The second feature—namely relatively long life—is achieved through the use of pulse width modulation (PWM) to sample the probe in the cathode configuration. This approach significantly reduces any plating on the probe, thereby extending the life of the probe.

The third feature overcomes the false positive problem created by stray voltage and current by measuring current instead of voltage. The current limiters prevent the probe from drawing so much current that the probe will oxidize quickly and become unusable. The current limiters allow enough current to be drawn through the probe so that the signal from the probe is above the "noise" threshold for the stray voltage and current that exists on the top plate of a battery. This features improves the accuracy of decisions about the level of the electrolyte despite the presence of stray voltage and current.

These and other objects, advantages, and features of the invention will be more fully understood and appreciated by reference to the description of the current embodiment and the drawings.

DESCRIPTION OF THE CURRENT EMBODIMENTS

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The numeric values included in this description are exemplary only to describe the current embodiments. Other suitable numeric values for other embodiments will be readily apparent to those skilled in the art.

System

Figure 1:
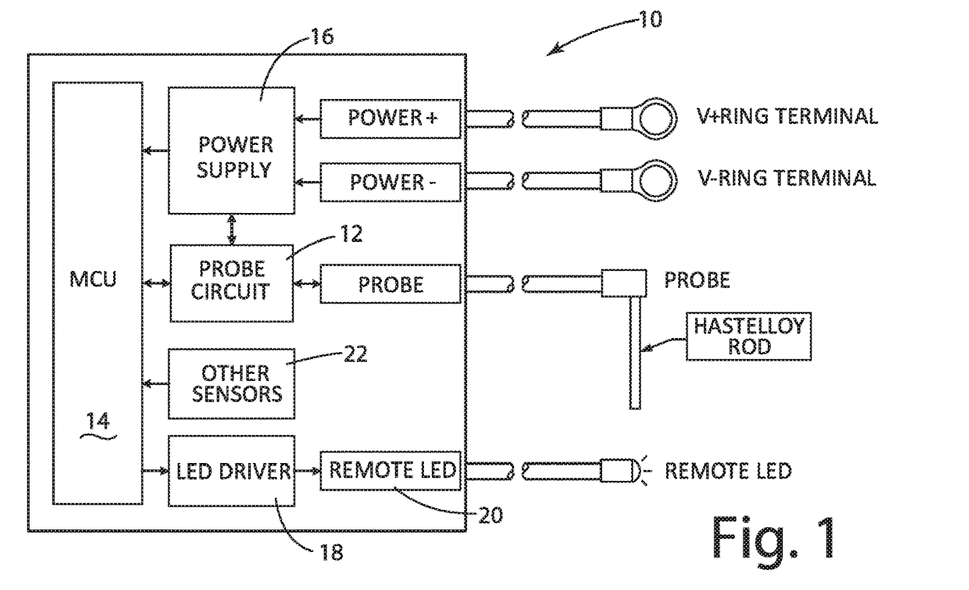
FIG. 1 is a block diagram of the battery electrolyte level monitoring system.

The battery electrolyte level monitor and/or system of the present invention is illustrated in FIG. 1 and generally designated 10. The system 10 includes a probe circuit 12, a probe 13, an MCU (microcontroller unit) 14, a power supply 16, an LED driver 18, a remote LED 20, and other sensors 22 (not relevant to the present invention).

Figure 2:
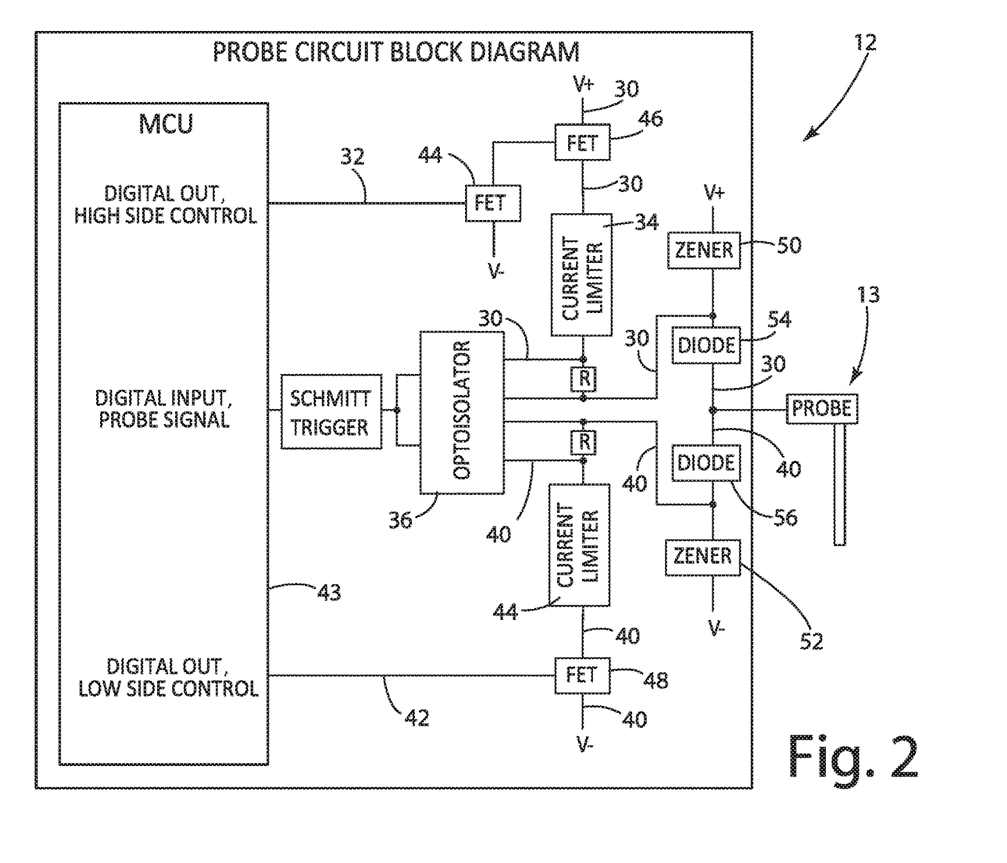
FIG. 2 is a block diagram of the probe circuit.

The probe circuit 12 is illustrated in FIG. 2. The probe circuit 12 includes an MCU 43, an optoisolator 36, FETs (field effect transistors) 44, 46, and 48, current limiters 34 and 44, Zener diodes 50 and 52, and diodes 54 and 56.

The probe circuit 12 is designed as a combination of two subcircuits—one that configures the probe 13 to behave as a cathode and another that configures the probe to behave as an anode.

The subcircuit path 30 in FIG. 2 shows the path that current flows through when the probe is configured as an anode. This path 30 is turned "on" by the high side control line 32. If the probe is in contact with electrolyte when configured as an anode, then current flows from V+ into the probe circuit through the current limiter 34 and optoisolator 36 and finally to the probe 13 and into the electrolyte of the battery cell (not illustrated). The probe 13 behaves as ground and is susceptible to material erosion due to electrolysis.

The subcircuit path 40 in FIG. 2 shows the path that current flows through when the probe is configured as a cathode. This path 40 is turned "on" by the low side control line 42. If the probe is in contact with electrolyte when configured as a cathode, then current flows from the electrolyte in the battery cell into the probe 13 through the optoisolator 36 and the current limiter 44 and finally to V−. The probe 13 behaves as a source and is susceptible to electroplating.

The measurement strategy for probe circuit 12 uses conductivity by measuring the current through the probe 13 rather than the voltage at the probe.

"Stray" voltage and current exists on the top plate of a battery due to cleanliness, battery condition, and battery construction materials. For any sensor to be effective on top of a battery, its measurements cannot be affected by stray voltage and current. By measuring current, the present invention overcomes the effects of stray voltage and current. This is believed to be unique to the battery monitoring industry.

The control circuit 12 includes current limiters 34 and 44 set to 20 mA, for example. The noise threshold is set at 16.5 mA, and consequently the control circuit 12 is unaffected by stray voltage and current. The 16.5 mA threshold is about 25% higher than what is believed to be the worst case of stray current on the top plate. Consequently, the probe signal will be above the noise threshold created by stray voltage and current. Accordingly, when the optoisolator 36 switches on and/or off, for either anode or cathode configuration, the probe input signal to the MCU 43 is accurate.

As a possible variation, the current limiting devices could be selected to have a higher current limit (e.g. change from 20 mA to 30 mA), which would enable more current to pass through the probe. This variation would yield a higher immunity to the "noise" on the top of the battery in the form of stray voltage and current. However, this variation would reduce probe life because, with more current passing through the probe material, oxidation or plating of the probe would be accelerated.

The cathode/anode configuration that is used by the firmware (within the MCU 43) depends upon where the probe 13 is placed in the battery relative to where the device 10 is powered on the battery. This feature enables the probe 13 to be placed in any cell of the battery and to perform its function. This feature of probe position independence is believed to be novel to the present invention. The allowable installation range for the probe 13, based on the current embodiment, is up to 80 V below the positive supply line (V+) for the device 10 and up to 80 V above the negative supply line (V−) for the device.

Figure 3A:
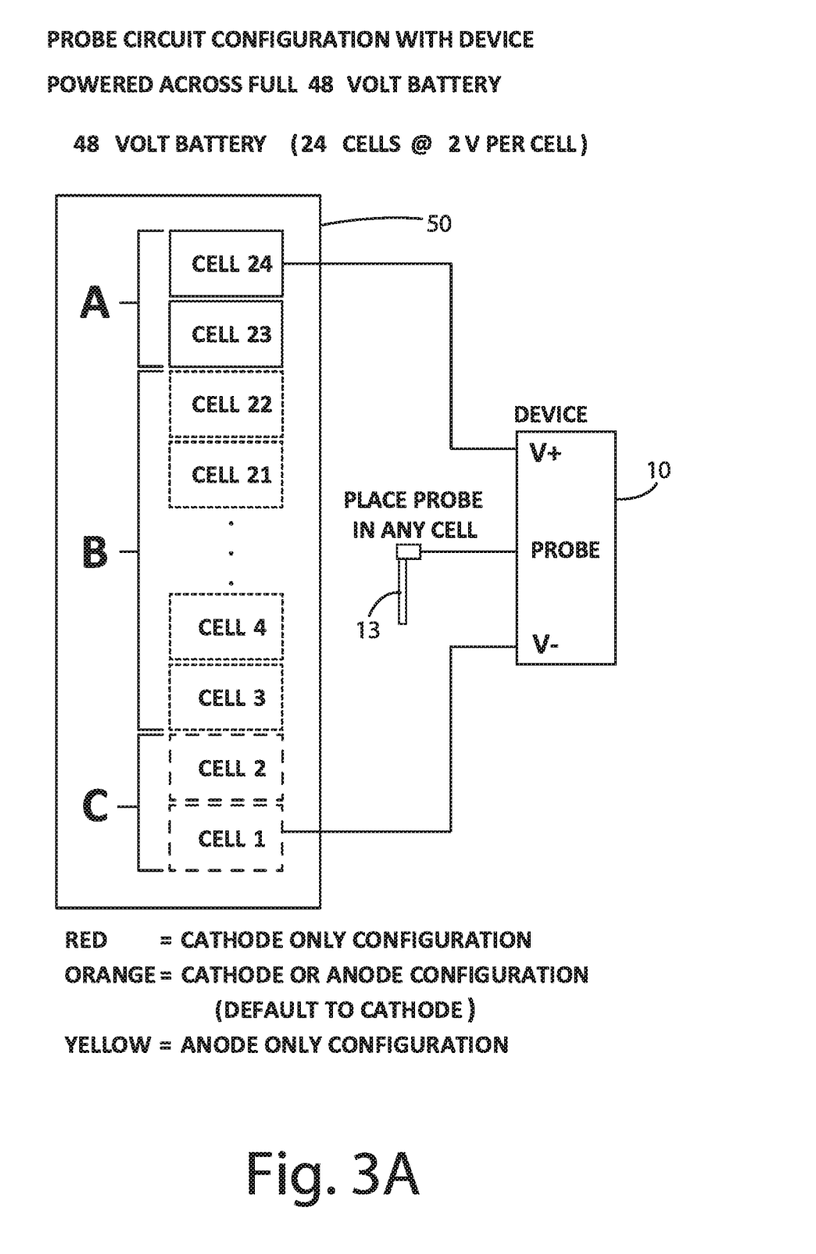
FIG. 3A is a schematic diagram of the system installed on a multi-cell battery and powered by 48 V.
Figure 3B:
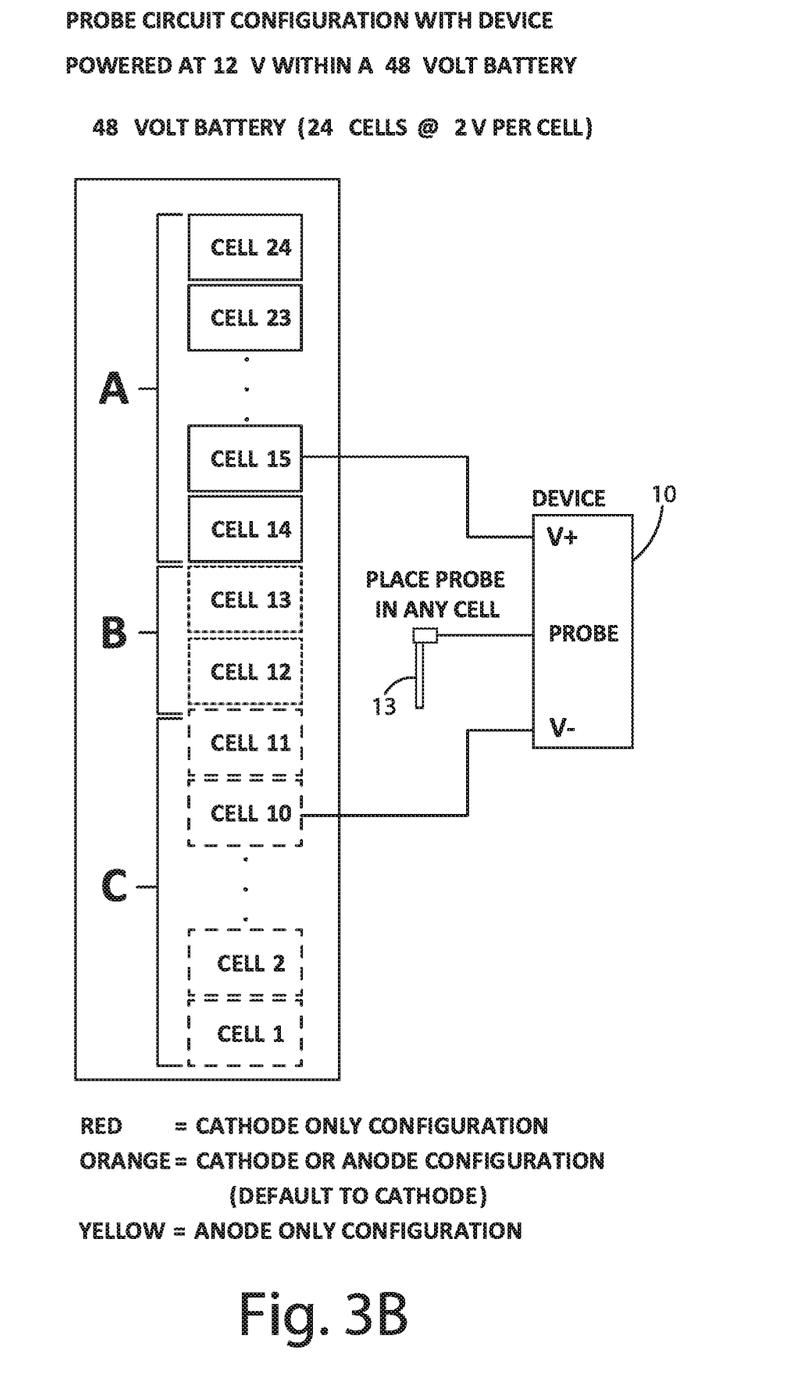
FIG. 3B is a schematic diagram of the system installed on a multi-cell battery and powered by 12 V.

FIGS. 3A and 3B illustrate (a) anode and (b) cathode configurations respectively of the probe 13 when the system 10 and the probe are installed on a 48-volt battery (a) with the device powered by 48 V and with (b) the device powered by 12 V respectively. Each figure illustrates a battery 50 including a 24 individual 2-volt cells connected in series, as is conventional for monobloc batteries or industrial batteries.

In FIG. 3A, the device 10 is powered across 24 cells, so the device is powered by 48 V. Placing the probe 13 into either of cells 1 or 2 would result in the probe circuit 12 operating in anode only configuration. Placing the probe 13 into any of cells 3-22 would result in the probe circuit 12 operating in cathode or anode configuration (with a default to cathode configuration). Placing the probe 13 into either of cells 23 or 24 would result in the probe circuit 12 operating in cathode only configuration.

In FIG. 3B, the device 10 is powered across 5 cells, so that the device is powered by 12 V. Placing the probe into any of cells 1-11 would result in the probe circuit 12 operating in anode only configuration. Placing the probe into either of cells 12 or 13 would result in the probe circuit 12 operating in cathode or anode configuration (with a default to cathode configuration). Placing the probe 13 into any of cells 14-24 would result in the probe circuit 12 operating in cathode only configuration.

The probe circuit 12 and the controlling firmware enable independent control of the high side and low side of the probe circuit with digital control lines 32 and 42 from the MCU 43. The high side of the circuit 12 controls the anode configuration and the low side of the circuit controls the cathode configuration. This approach enables the use of a PWM signal for the control lines 32 and 42 with a percent of duty cycle "on time" intended to optimize the life of the probe 13 by reducing the effects of electrolysis and electroplating. The firmware will always default to configuring the circuit 12 in cathode mode first and, only if no signal is present in cathode mode, then try anode mode.

If no signal is present in either mode, then the probe is not in contact with electrolyte; and the device will properly alert the user. In addition to using a PWM control signal, the logic for the cathode first and anode second order of operation extends the life of the probe 13 for as long as possible.

For the PWM control signal, we have observed that a good threshold for duty cycle on time is approximately 0.01% of the sample period time. For example, if the sampling rate is once every second, then the probe should turn on for 100 microseconds or less in order to stay at or below the 0.01% duty cycle target. This control scheme extends the useful life of the physical probe 13 when configured as an anode. With the PWM control, the estimated life for a probe in the cathode configuration is approximately 570 years; and the estimated life for a probe in the anode configuration is over 16 years.

Figure 4A:
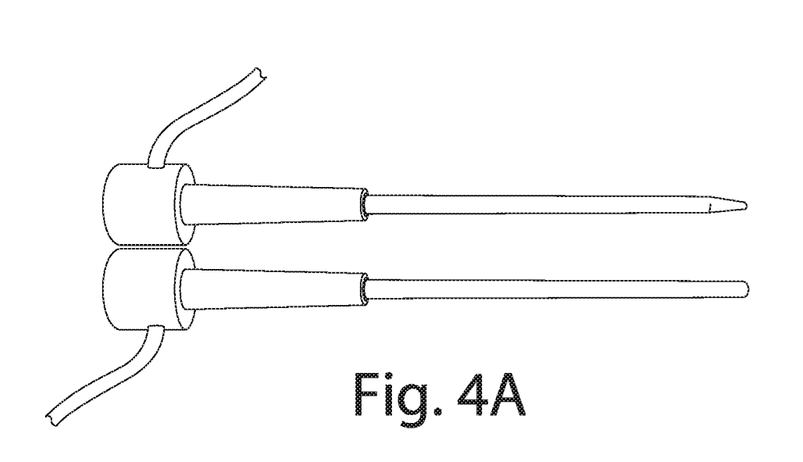
FIG. 4A is a picture of a probe after 16+ years of simulated use in conjunction with the present invention (in comparison to a new probe).
Figure 4B:
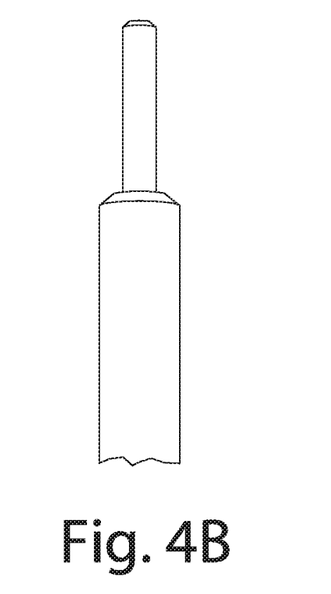
FIG. 4B is a picture of a probe following more than 600 years of cathode configuration of the present invention.
Figure 5:
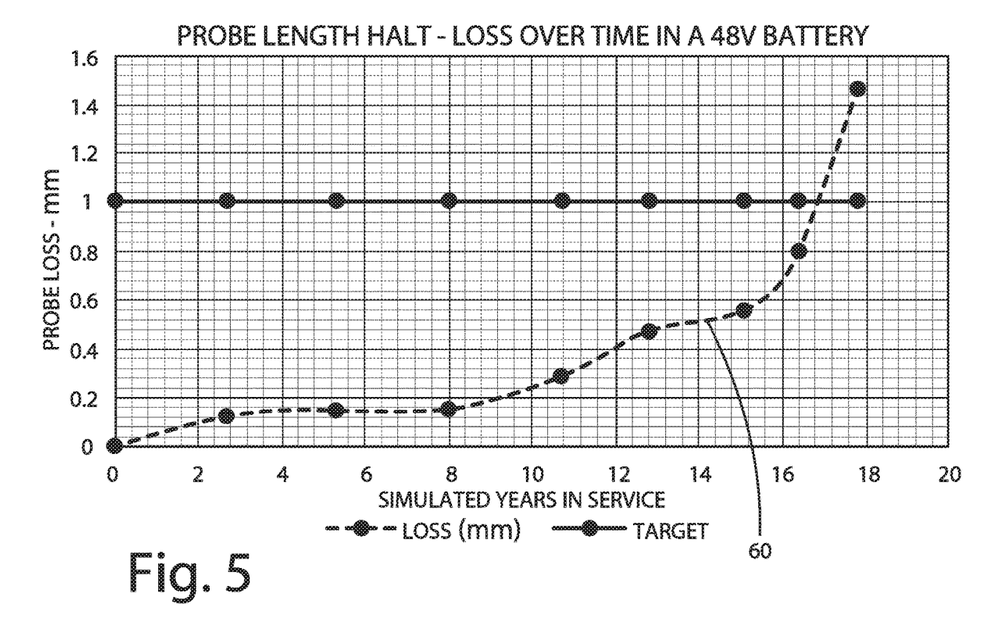
FIG. 5 is a graph of the "loss of length" data for a probe used in the anode configuration of the present invention.

A probe after 16 years of anode configuration (in comparison to a new probe) is illustrated in FIG. 4A. A probe after more than 600 years of cathode configuration is illustrated in FIG. 4B. FIGS. 4A and 4B graphically demonstrate the long lives of probes possible using the techniques of the present invention area FIG. 5 graphically presents the data for an anode probe over a period of 18 years of service. The line 60 shows the loss in physical probe length during that period. About 16.8 years is the point where the probe cumulatively over time has lost 1 mm of length.

Figure 6:
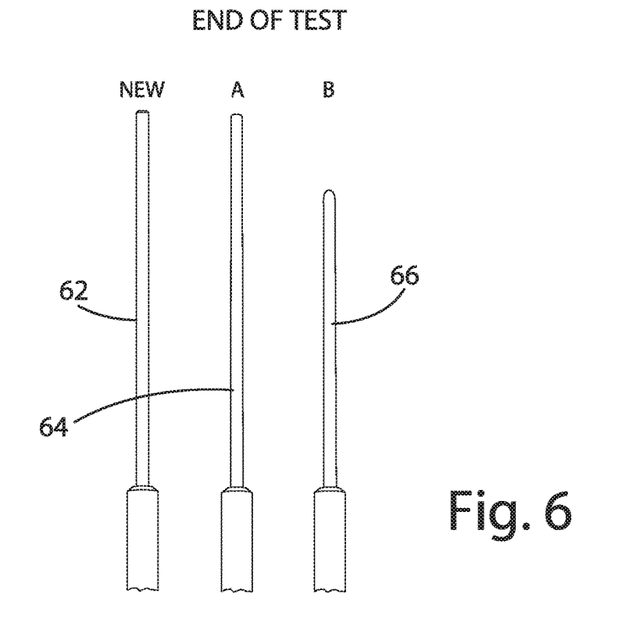
FIG. 6 is a picture of three probes—one new and the other two used, having been operated in different configurations.
Figure 7:
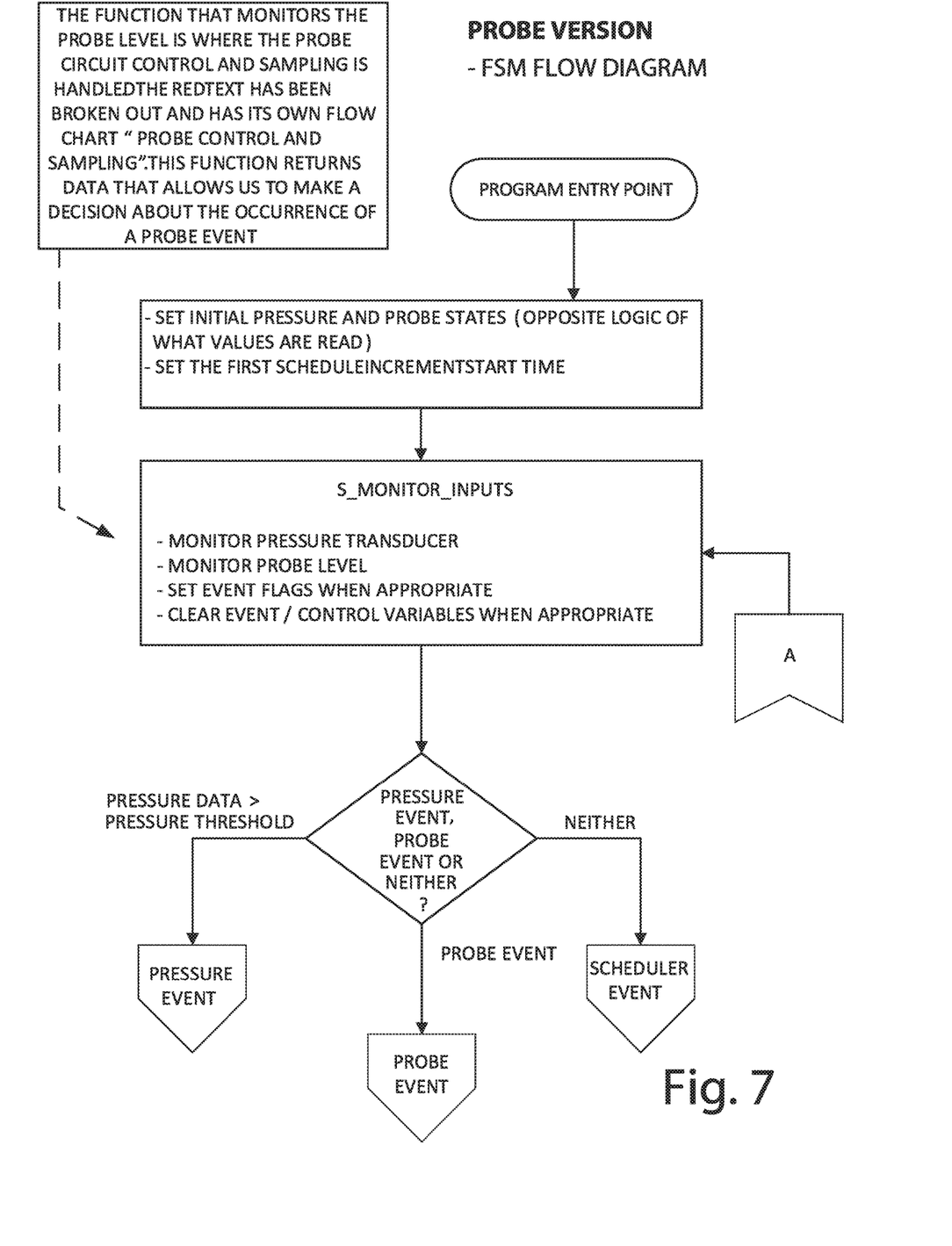
FIG. 7 is an FSM (finite state machine) flow diagram for the firmware within the probe circuit.
Figure 8:
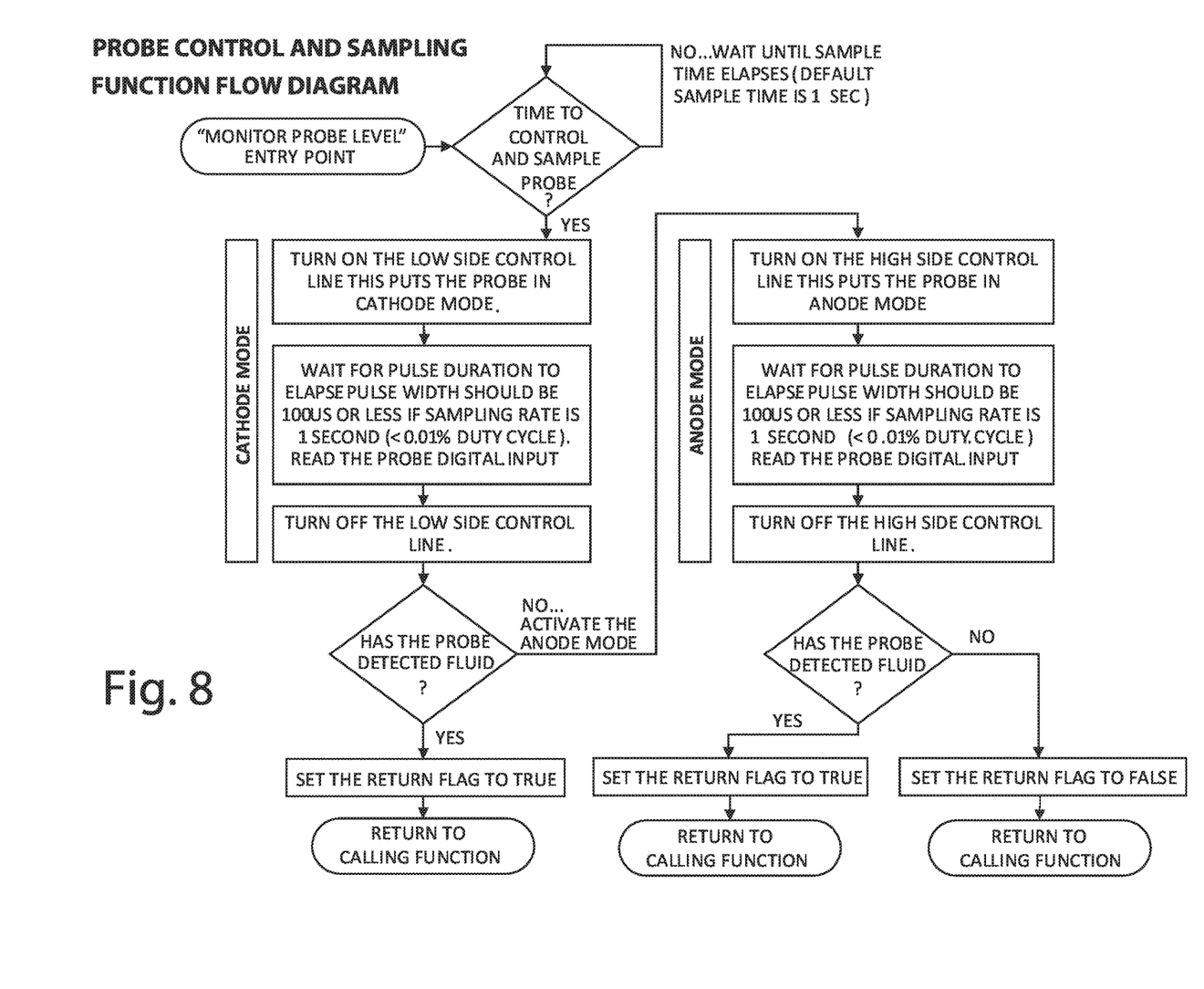
FIG. 8 is a probe control and sampling function flow diagram.
Figure 9:
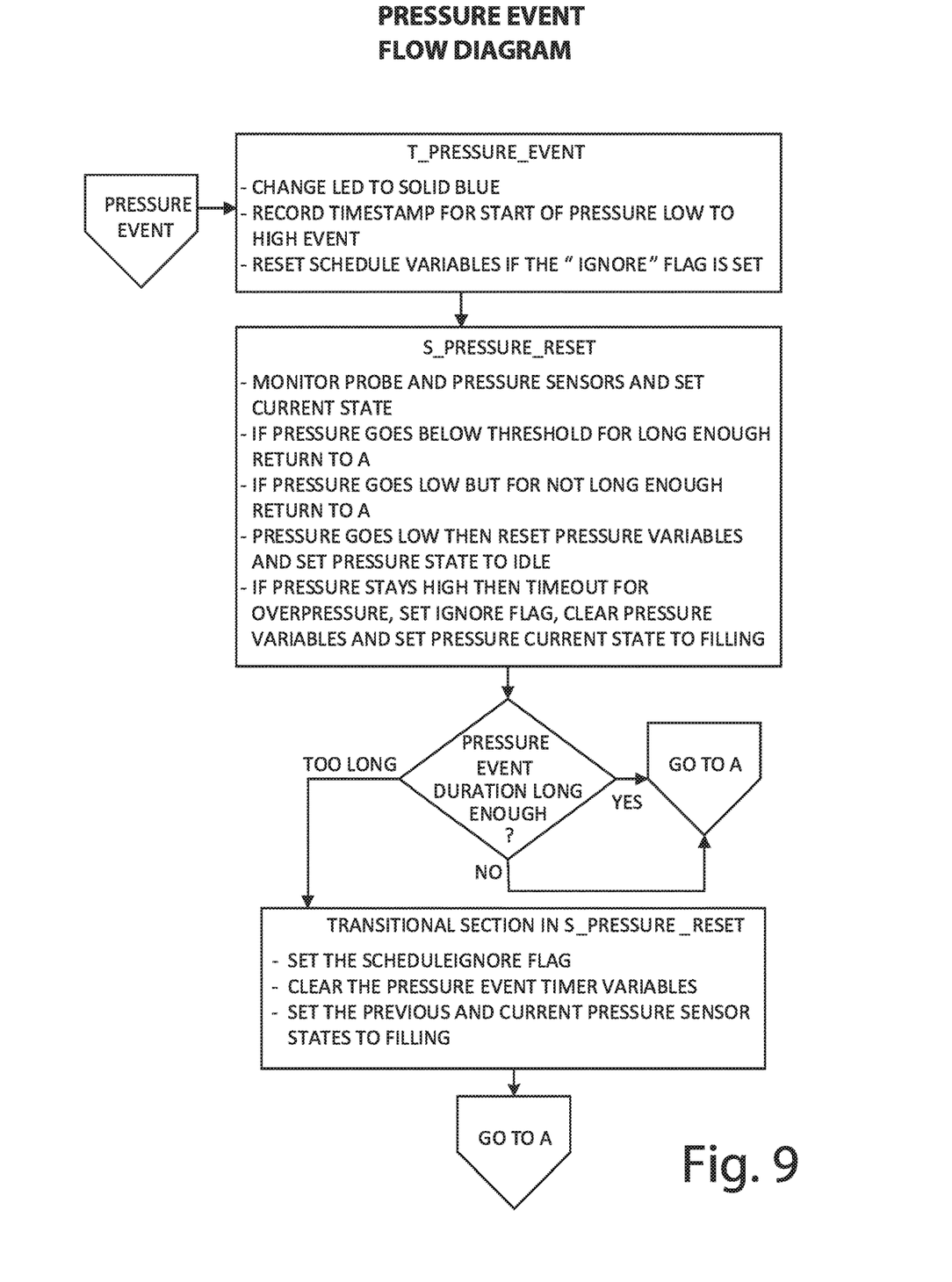
FIG. 9 is a pressure event flow diagram.
Figure 10:
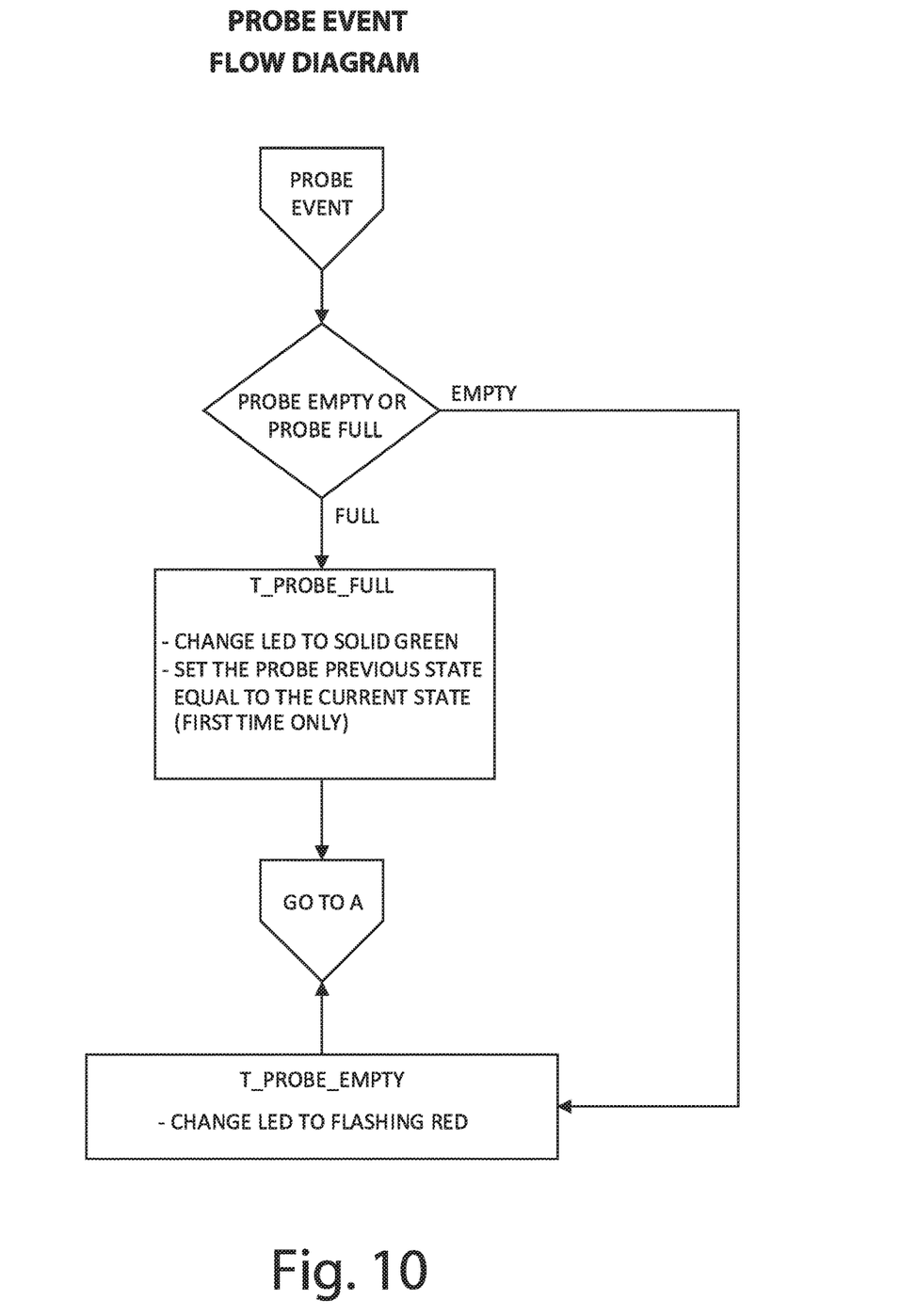
FIG. 10 is a probe event flow diagram.
Figure 11:
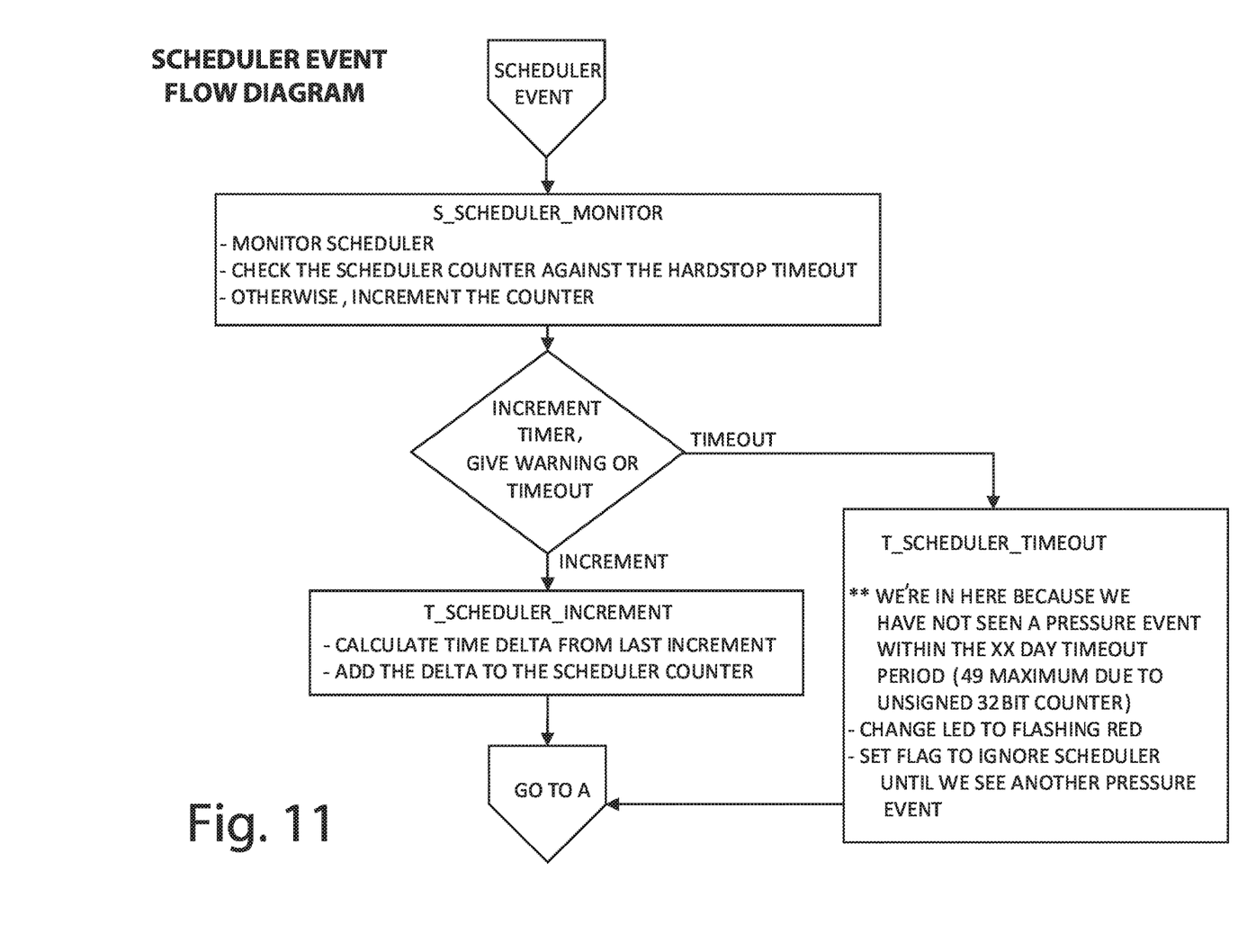
FIG. 11 is a scheduler event flow diagram.
Figure 12:
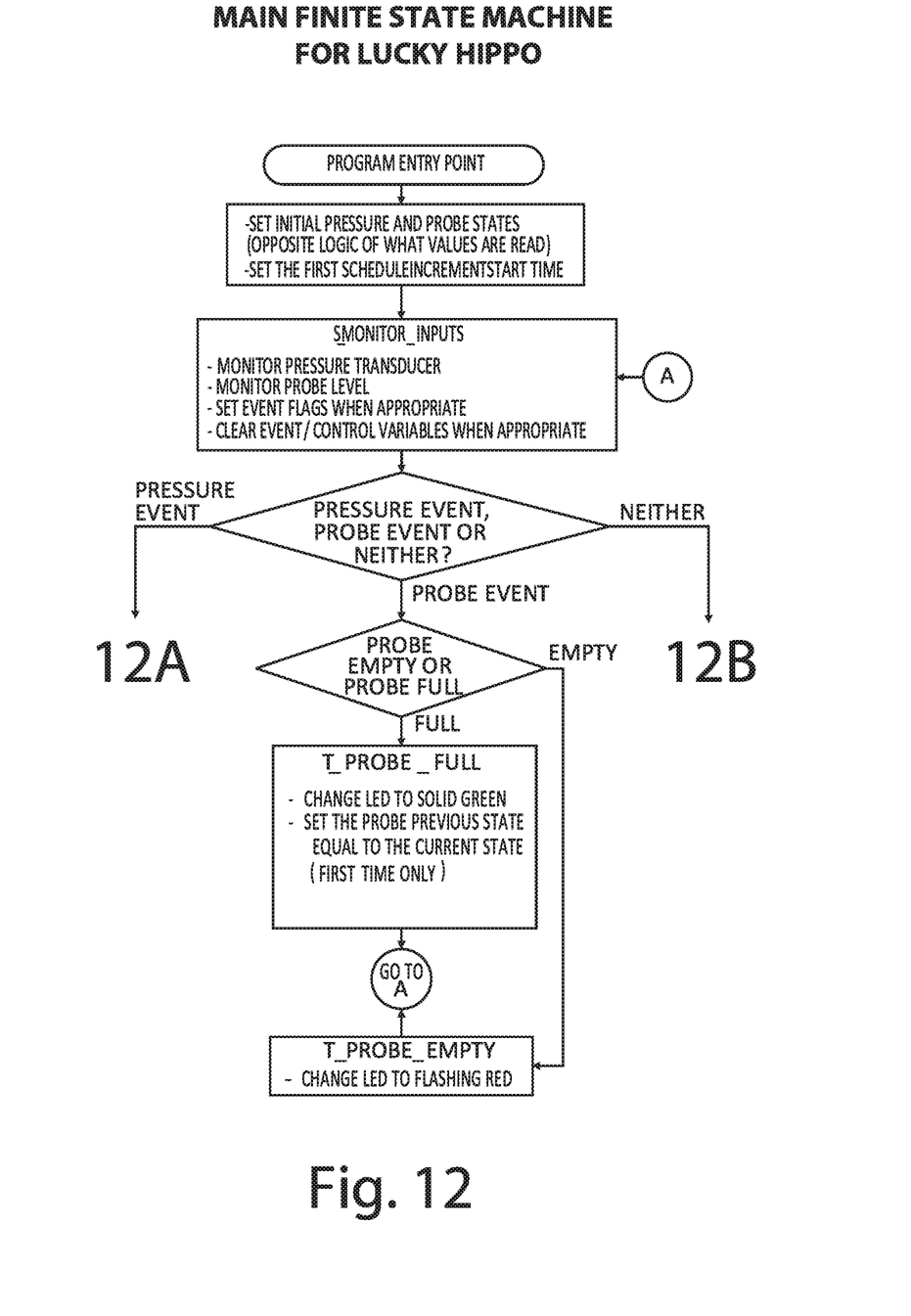
FIGS. 12, 12A, and 12B are an FSM combined overall flow diagram for the firmware within the system.
Figure 12A:
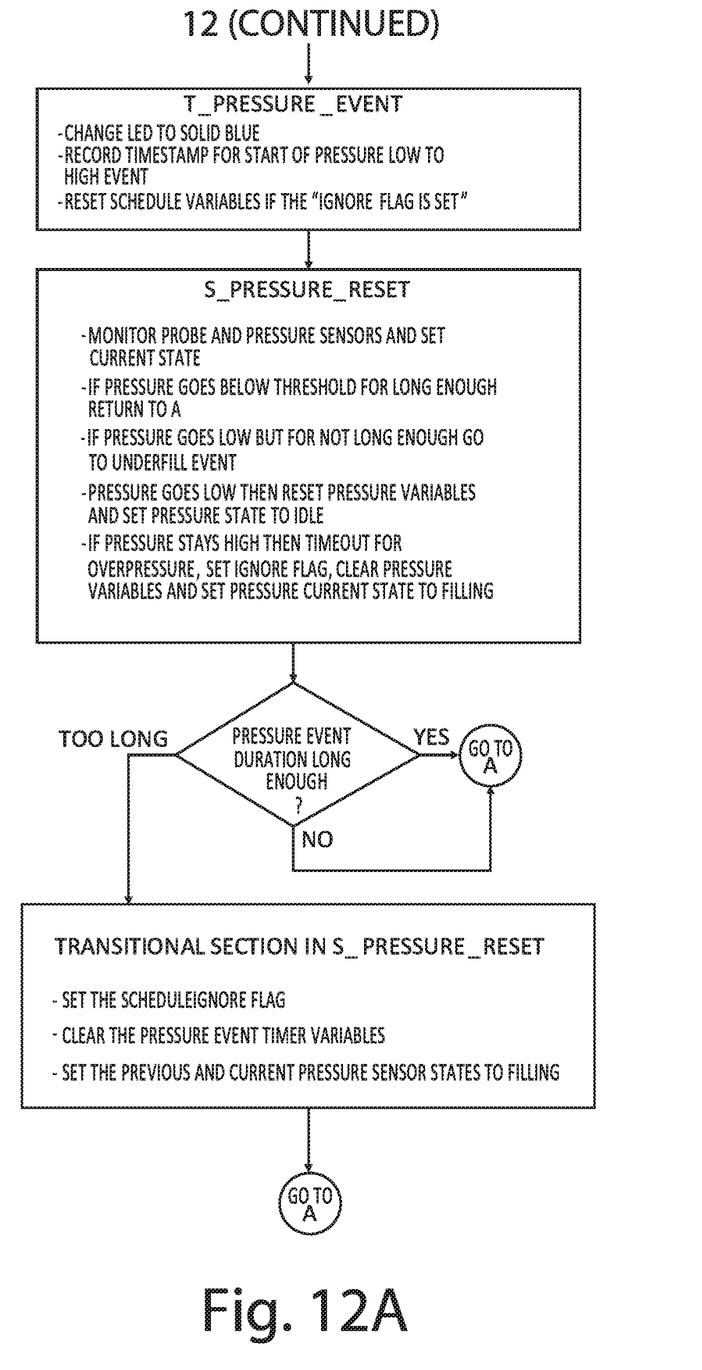
Figure 12B:
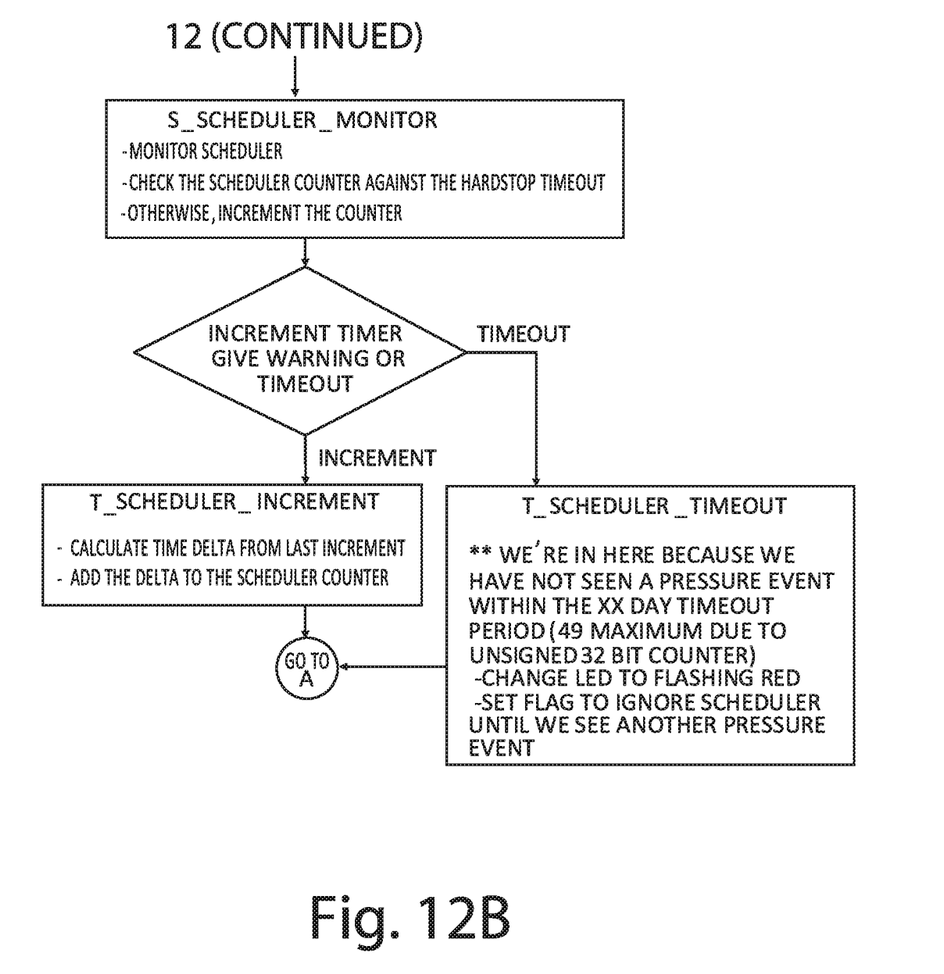

In stark contrast, without the use of PWM control, a probe in the anode configuration would be consumed in about 48 hours. FIG. 6 shows the comparison between a new probe 62, a cathode configuration probe 64 (operated under PWM control), and an anode configuration probe 66 (operated for 48 hours without PWM control—i.e. 100% on time).

The selection of the probe material has a significant impact on the life of the probe, regardless of the configuration. The material preferably should be capable of surviving inside of a lead acid battery cell with exposure to sulfuric acid and high temperatures. Alloys sold by Haynes International under the trademark Hastelloy have been identified as particularly desirable materials because of their ability to withstand the extremely harsh environmental conditions. However, with use of the present invention that extends the life of any probe, other potentially suitable materials include stainless steel, lead, and conductive plastic such as PVDF (polyvinylidene difluoride). Considerations in material selection include environmental requirements and cost.

Control

Diagrams illustrating the architecture and the firmware used by the system MCU 14 and the probe circuit MCU 43 are illustrated in FIGS. 7-12, 12A, and 12B. These diagrams provide sufficient detail to enable one skilled in the art to prepare the code required to implement the diagrams. Consequently, the diagrams are self-explanatory; and a detailed review of the diagrams is unnecessary.

Alternative Sampling Strategy

The sampling strategy as described thus far is to sample in the cathode configuration first and, if we do not receive a positive signal, then sample in the anode configuration second. If either returns a positive signal, then the probe 13 is in fluid and the LED 20 is illuminated. This approach is effectively a logical "or" method.

An alternate sampling strategy, especially useful for "noisy" batteries, is to sample in the cathode configuration and to sample in the anode configuration every time. If both samples return a positive signal, then the probe is known to be in fluid. This is effectively a logical "and" method. This method provides higher confidence that the signal is accurate, because the cathode sampling signal and the anode sampling signal are required to agree. However, this method comes at the cost of reducing the useful life of the probe, because the probe will be sampled in the anode configuration every time. But, because the probe is believed to have a useful life of 16+ years even when operated in the anode configuration (with PWM), the reduced probe life provides little, if any, practical adverse impact on the system life.

As an additional consideration, the alternative method will restrict the placement of the probe in the battery to a cell where the probe can be operated in both the cathode configuration and the anode configuration. Usually, and as illustrated in FIGS. 3A and 3B, the cathode-only location is the first two cells and the anode-only location is the last two cells of the battery. Consequently, in an industrial 48 V system (for example), the probe could be placed in any of cells 3-22.

In summary, the alternative method (a) increases the confidence in the signal from the probe, (b) limits the effective life of each probe to be the same as if the probe were operated in the anode only mode, and (c) modestly restricts the placement of the probe in the battery.

Advantages

One advantage of the present invention is the ability to ignore/overcome electrical noise on the top of battery, which again is known as "stray voltage and current." The design of the present invention is not affected by stray voltage and current, and the invention enables every decision about electrolyte level to be accurate.

Another advantage of the present invention is the probe position independence. The present invention enables the user to install the probe into any cell in the battery, and the probe will work regardless of the cell selected. This advantage is enabled by the ability to configure the probe as a cathode or an anode. The invention is an integral piece of a battery monitoring system that can accurately measure the electrolyte level inside of a battery cell independently of which battery cell the probe is placed. The functionality and measurement of the device and probe circuit is also independent of the battery cells used to power the system.

Yet another advantage of the present invention is the ability to measure the level of the electrolyte in any cell in the battery regardless of position. The probe can function as a cathode and/or as an anode. The probe can be installed anywhere in the battery regardless of the battery cells used for power. The disclosed embodiment requires, for example, 12 V to 48 V for the device to operate. However, the probe is attached to the device with its own single wire and can be installed in any cell in the battery—i.e. above, below, exactly on, or in between the cells from which the device is receiving power within a −80 V to +80 V range.

We have been able to measure an effective life of the probe of 16+ years. This is based on our self-imposed 1 mm "loss of length" specification. The probe would continue to function beyond 16+ years, but could be out of specification (e.g. the 1 mm specification) and may not meet the requirements of the user.

Also, because the system is a powered system including a microcontroller, the functions of (a) measuring the probe signal and (b) driving the LED indicator(s) can be—and are—separated. This results in the LED intensity being independent of the voltage the probe is able to measure. The LED can be driven at full intensity or be off regardless of (a) the cell in which the probe is installed and (b) whether the probe is in or out of contact with the electrolyte.

CONCLUSION

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A method of sampling the level of electrolyte in a cell of a multi-cell battery, the method comprising the steps of:
  inserting an electrically conductive probe into the cell;
  first current sampling the probe as a cathode to determine a cathode current signal;
  second current sampling the probe as an anode to determine an anode current signal;

determining, as a function of both of the cathode current signal and the anode current signal, if the probe is in contact with electrolyte within the cell; and indicating if the probe is in contact with electrolyte in the cell.

2. A method as defined in claim 1 wherein the second current sampling step includes using PWM.

3. A method as defined in claim 2 wherein:
the first current sampling step includes limiting the current through the probe; and
the second current sampling step includes limiting the current through the probe.

4. A method as defined in claim 1 wherein the indicating step includes illuminating a light source.

5. A method as defined in claim 1 wherein one of the first and second current sampling steps is performed only if the current signal determined by the other of the first and second current sampling steps has a predefined value.

6. A method as defined in claim 5 wherein the one of the first and second current sampling steps is the second current sampling step.

7. A method of sampling the level of electrolyte in a cell of a multi-cell battery, the method comprising the steps of:
inserting an electrically conductive probe into the cell;
first current sampling the probe as a cathode to determine a cathode current signal, the first current sampling including limiting the current through the probe;
second current sampling the probe as an anode to determine an anode current signal, the second current sampling including limiting the current through the probe;
determining, as a function of both of the cathode current signal and the anode current signal, if the probe is in contact with electrolyte within the cell; and
indicating if the probe is in contact with electrolyte in the cell.

8. A method as defined in claim 7 wherein the second current sampling step includes using PWM.

9. A method as defined in claim 7 wherein the indicating step includes illuminating a light source.

10. A method as defined in claim 7 wherein one of the first and second current sampling steps is performed only if the current signal determined by the other of the first and second current sampling steps has a predefined value.

11. A method as defined in claim 10 wherein the one of the first and second current sampling steps is the second current sampling step.

12. A method of sampling the level of electrolyte in a cell of a multi-cell battery, the method comprising the steps of:
inserting an electrically conductive probe into the cell;
first current sampling the probe as a cathode to determine a cathode current signal;
second current sampling the probe as an anode using PWM to determine an anode current signal;
determining, as a function of both of the cathode current signal and the anode current signal, if the probe is in contact with electrolyte within the cell; and
indicating if the probe is in contact with electrolyte in the cell.

13. A method as defined in claim 12 wherein the first and second current sampling steps include limiting the current through the probe.

14. A method as defined in claim 12 wherein the indicating step includes illuminating a light source.

15. A method as defined in claim 12 wherein one of the first and second current sampling steps is performed only if the current signal determined by the other of the first and second current sampling steps has a predefined value.

16. A method as defined in claim 15 wherein the one of the first and second current sampling steps is the second current sampling step.

\* \* \* \* \*